United States Patent
Takahashi

(10) Patent No.: US 7,777,545 B2
(45) Date of Patent: Aug. 17, 2010

(54) SEMICONDUCTOR DEVICE AND TIMING ADJUSTING METHOD FOR SEMICONDUCTOR DEVICE

(75) Inventor: Hiroyuki Takahashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/385,493

(22) Filed: Apr. 9, 2009

(65) Prior Publication Data

US 2009/0256611 A1 Oct. 15, 2009

(30) Foreign Application Priority Data

Apr. 10, 2008 (JP) .............................. 2008-102221

(51) Int. Cl.
*H03H 11/26* (2006.01)

(52) U.S. Cl. ........................ 327/270; 327/273; 327/295; 327/160; 327/161

(58) Field of Classification Search ......... 327/269–271, 327/273, 291, 293, 295, 144, 158–161
See application file for complete search history.

(56) References Cited

U.S. PATENT DOCUMENTS

| 5,796,993 | A | 8/1998 | Maguire |
| 7,301,830 | B2 | 11/2007 | Takahashi et al. |
| 7,466,609 | B2 | 12/2008 | Takahashi et al. |
| 2005/0237848 | A1 | 10/2005 | Takahashi et al. |
| 2008/0056031 | A1 | 3/2008 | Takahashi et al. |

FOREIGN PATENT DOCUMENTS

| JP | 10-294379 | 11/1998 |
| JP | 3866594 | 10/2006 |

*Primary Examiner*—An T Luu
(74) *Attorney, Agent, or Firm*—Foley & Lardner LLP

(57) ABSTRACT

In a semiconductor device, a delaying circuit is configured to delay an input signal based on an internal setting data to output as a timing signal. A delay determining section is configured to determine a delay state of each of a plurality of delay signals obtained by delaying the timing signal, based on the plurality of delay signals. A program section is configured to change the internal setting data based on the delay state.

15 Claims, 10 Drawing Sheets

SEMICONDUCTOR DEVICE AND TIMING ADJUSTING METHOD FOR SEMICONDUCTOR DEVICE

INCORPORATION BY REFERENCE

This patent application claims priority on convention based on Japanese Patent Application No. 2008-102221. The disclosure thereof is incorporated herein by reference.

BACKGROUND OF THE INVENTION

1. Field of the Invention

The present invention relates to a semiconductor device and a timing adjusting method for the semiconductor device, in particular, to a semiconductor device which automatically adjusts internal timing and a timing adjusting method for the semiconductor device.

2. Description of Related Art

It has been known that an internal timing signal (hereinafter, referred to as merely a "timing signal") is used to control an operation of each of circuit sections of a semiconductor device. For example, the timing signal is generated from an external clock signal by a delay circuit. In a semiconductor device, recently, lowering a power supply voltage has advanced for demand for reduction of a power consumption amount. As the lowering of the power supply voltage, dependency of delay time of a transistor (tpd) on variation of the power supply voltage VDD and a threshold voltage Vth is increasing. For this reason, variation of delay time in the delay circuit may increase. Due to such increase of the variation in the delay circuit, it may be difficult to ensure an internal operation margin in the semiconductor device.

As a method of suppressing a variation of the delay time in the delay circuit, it could be considered to integrate a resistance element into the delay circuit as a delay element. Thereby, influence of variations of the power supply voltage VDD and the threshold voltage Vth in a transistor of the delay circuit can be suppressed. As a result, the variation of delay time in the delay circuit can be suppressed. For example, it is described in "Delay Circuit, Semiconductor Storage Device and Method for controlling Semiconductor Storage Device" described in Japanese Patent Publication No. 3,866,594, to use a resistance element in a delay circuit.

In conjunction with the above description, Japanese Patent Application Publication (JP-A-Heisei 10-294379 (corresponding to U.S. Pat. No. 5,796,993) discloses "Method and Apparatus for Optimization of Semiconductor Device by Using On-chip Confirmation Circuit". This method optimizes timing of a semiconductor integrated circuit device. The method including (a) receiving a control delay amount; (b) producing a modified device timing based on the control delay amount; (c) testing the modified device timing by using on-chip confirmation circuit to determine if the semiconductor integrated circuit device can function as a device; (d) receiving a new control delay amount, where the new control delay amount replaces the control delay amount and is different from the control delay amount; and (e) repeating steps (b) to (e) to determine an optimal control delay amount for the semiconductor integrated circuit device.

Other factors varying the delay time in the delay circuit include manufacturing variation. In a process with a large manufacturing variation of the resistance element, the delay circuit using the resistance element is influenced by the manufacturing variation of the resistance element in addition to manufacturing variation of transistors. For this reason, even if variations of the power supply voltage VDD and the threshold voltage Vth of the transistor can be suppressed, the variation of the delay time in the delay circuit may not be sufficiently reduced due to the influence of manufacturing variation. There is a demand for a technique of suppressing variation including the manufacturing variation in the delay time.

SUMMARY

In an aspect of the present invention, a semiconductor device includes: a delaying circuit configured to delay an input signal based on an internal setting data to output as a timing signal; a delay determining section configured to determine a delay state of each of a plurality of delay signals obtained by delaying the timing signal, based on the plurality of delay signals; and a program section configured to change the internal setting data based on the delay state.

In another aspect of the present invention, a method of adjusting timing of a semiconductor device, is achieved by delaying an input signal based on internal setting data by a delaying circuit to output as a timing signal; by determining a delay state of each of a plurality of delay signals obtained by sequentially delaying the timing signal based on the plurality of delay signals; and by changing the internal setting data based on the delay state such that the timing signal approaches an optimum signal.

In still another aspect of the present invention, a semiconductor device includes: a first circuit configured to generate a plurality of output signals from an input signal; and a determining circuit configured to adjust the input signal based on states of the plurality of output signals during a predetermined period.

According to the present invention, it is possible to provide a semiconductor device capable of suppressing a variation of delay time including a manufacturing variation in a delay circuit.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Hereinafter, a semiconductor device according to the present invention will be described in detail with reference to the attached drawings.

Figure 1:
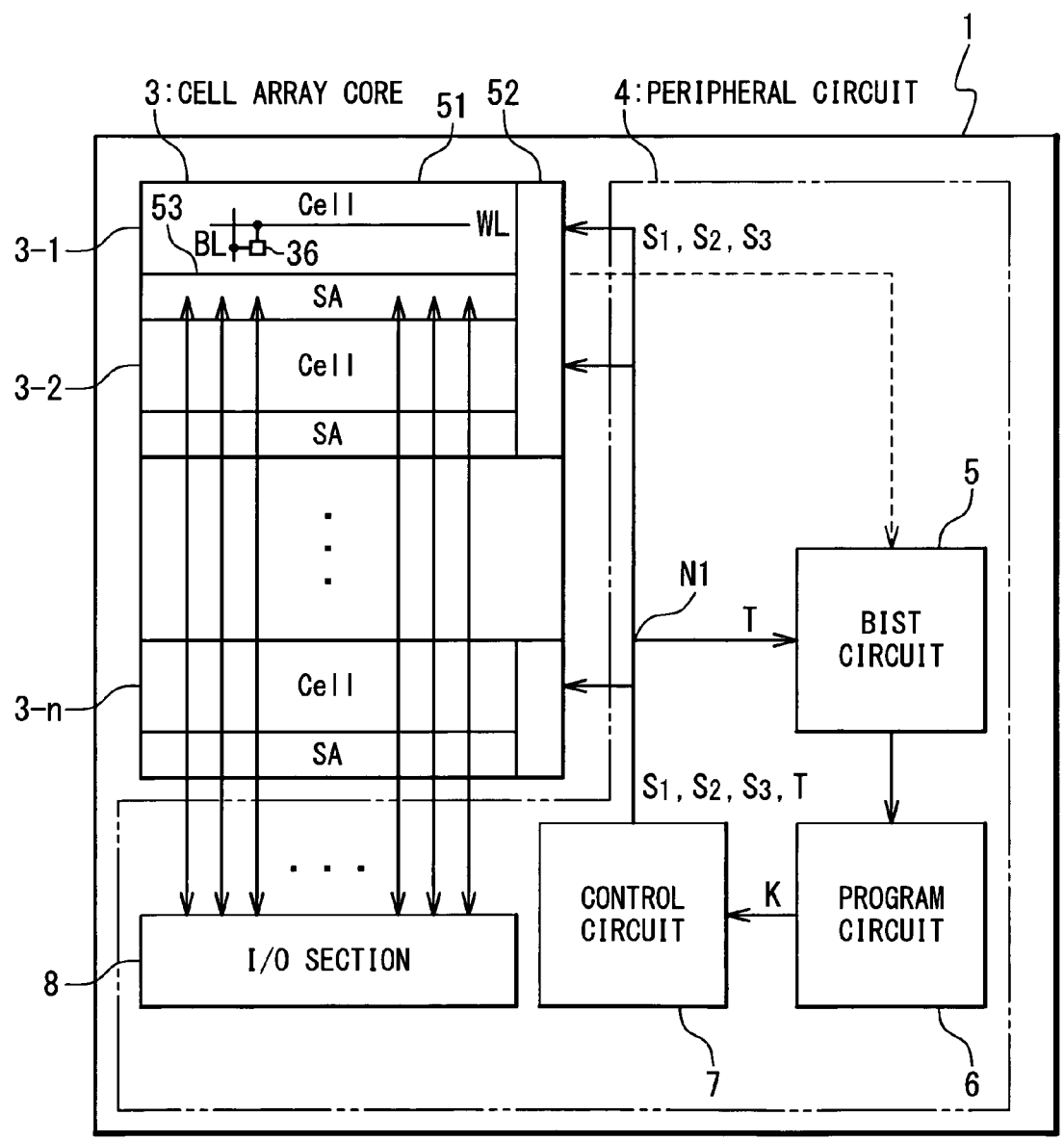
FIG. 1 is a block diagram showing a configuration of a semiconductor device according to an embodiment of the present invention.

FIG. 1 is a block diagram showing a configuration of the semiconductor device according to an embodiment of the present invention. A semiconductor device 1 is exemplified as a memory or a memory-mixed LSI (Large Scale Integration). The semiconductor device 1 includes a cell array core 3 and a peripheral circuit 4. The cell array core 3 and the peripheral circuit 4 function as a memory and are exemplified as a DRAM core.

The cell array core 3 stores data under control by the peripheral circuit 4. For the control, a timing signal from a control circuit 7 of the peripheral circuit 4 to be described later is used. The cell array core 3 has a plurality of cell array cores 3-1 to 3-*n* (n is a natural number). Hereinafter, these cores may be merely referred as the cell array core 3 unless they need to be specifically distinguished. The cell array core 3 includes a cell array (Cell) 51, a word line driving section (WD) 52 and a sense amplifier section (SA) 53. The cell array 51 includes a plurality of word lines WL, a plurality of bit lines BL and a plurality of cells 36 arranged at intersection points of the plurality of word lines WL with the plurality of bit lines BL (Bit) in a matrix. The word line driving section 52 has a word line driving circuit 21, a bit line precharge circuit 22 and a row decoder (not shown). The sense amplifier section 53 has a plurality of sense amplifiers and a sense amplifier driving circuit 23.

Figure 3:
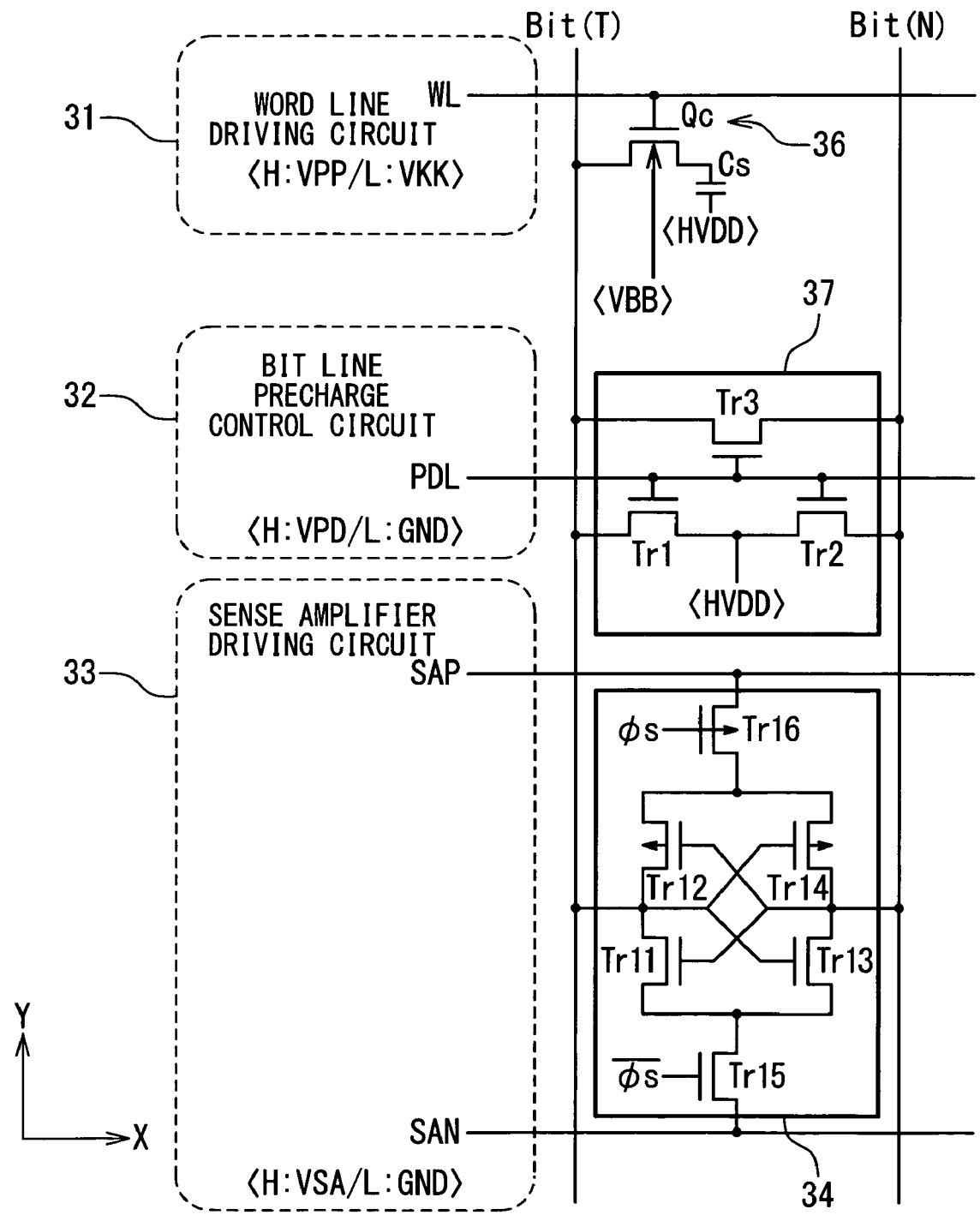
FIG. 3 is a schematic view showing a configuration of a cell array core according to the embodiment of the present invention.

FIG. 3 is a circuit diagram schematically showing a configuration of a cell array core in the present embodiment. The cell array core 3 has bit lines Bit (T) and Bit (N), a word line WL, a memory cell 36, a precharge control line PDL, sense amplifier control lines SAP and SAN, a word line driving circuit 31, a bit line precharge driving circuit 32, a sense amplifier driving circuit 33, a sense amplifier 34 and a precharge circuit 37.

The bit lines Bit (T) and Bit (N) extend in a Y direction. The bit lines Bit (T) and Bit (N) are selected by a column decoder (not shown) of the peripheral circuit 4. The word line WL extends in an X direction orthogonal to the Y direction and is connected to the word line driving circuit 21. The word line WL is selected by a row decoder (not shown). The memory cell 36 is provided at an intersection point of the bit lines Bit (T) and Bit (N) with the word line WL. The memory cell 36 includes a selection transistor Qc and a cell capacity Cs.

The word line driving circuit 31 supplies a voltage for driving the selection transistor Qc of the memory cell 36 (VPP for a High state (for example, 2.5V) and VKK for a Low state (for example, 0.4V)) to the word line WL. The sense amplifier driving circuit 33 supplies a voltage for driving the sense amplifier 34 (VDD on a High side (for example, 1.0V) and GND on a Low side (for example, 0V)) to the sense amplifier 34 through the sense amplifier control lines SAP, SAN, respectively. Based on control signals s and/s supplied from the sense amplifier driving circuit 33 or the other control circuit, the sense amplifier 34 detects a voltage difference between the pair of bit lines Bit (T) and Bit (N) and amplifies the difference. Data in the memory cell 36 is read based on the amplified potential difference. The precharge circuit 37 precharges the pair of bit lines Bit (T) and Bit (N) to a reference voltage VDD/2. The bit line precharge control circuit 32 supplies a voltage for driving the precharge circuit 37 (VPD for a High state (for example, 1.2V) and GND for a Low state (for example, 0V)) to the precharge circuit 37 through a precharge control line PDL. As described below, timing at which each of the above voltages is supplied is controlled by a control signal from the control circuit 7 of the peripheral circuit 4.

Referring to FIG. 1 again, the peripheral circuit 4 included in the semiconductor device 1 controls the cell array core 3. The peripheral circuit 4 has a BIST (Built In Self Test) circuit 5, a program circuit 6, a control circuit 7 and an I/O section 8.

The control circuit 7 controls an operation of the cell array core 3. The control circuit 7 has a delay section 7a (to be described later) for generating a timing signal for controlling an operation of each circuit. The delay section 7a generates timing signals (for example, S1, S2, S3, T) obtained by delaying an input signal such as an external clock signal by a delay circuit on the basis of internal setting. The generated timing signals S1 to S3 are outputted to the cell array core 3 and the generated timing signal T is outputted to the BIST circuit 5.

The BIST circuit 5 tests an operation of the semiconductor device 1. The BIST circuit 5 includes a delay determining section 5a (to be described later) for determining a delay state of the timing signal T based on the timing signal T generated by the delay section 7a. The delay state is represented by, for example, a magnitude and degree of a delay amount and relation with an input signal. The delay state of the timing signal T corresponds to delay states of the timing signals S1 to S3. The determined delay state is outputted to the program circuit 6.

The program circuit 6 executes programming of each circuit of the semiconductor device 1. The program circuit 6 includes a delay program circuit 6a for generating a delay changing signal K which changes internal setting of the delay section 7a to an optimum value based on the delay state determined by the delay determining section 5a. The delay program circuit 6a outputs the delay changing signal K to the delay section 7a. The delay section 7a changes a signal delay amount in the delay circuit according to the delay changing signal K.

An I/O section 8 inputs and outputs data to and from the cell array core 3. The I/O section 8 includes a column decoder and an I/O buffer (not shown).

Figure 2:
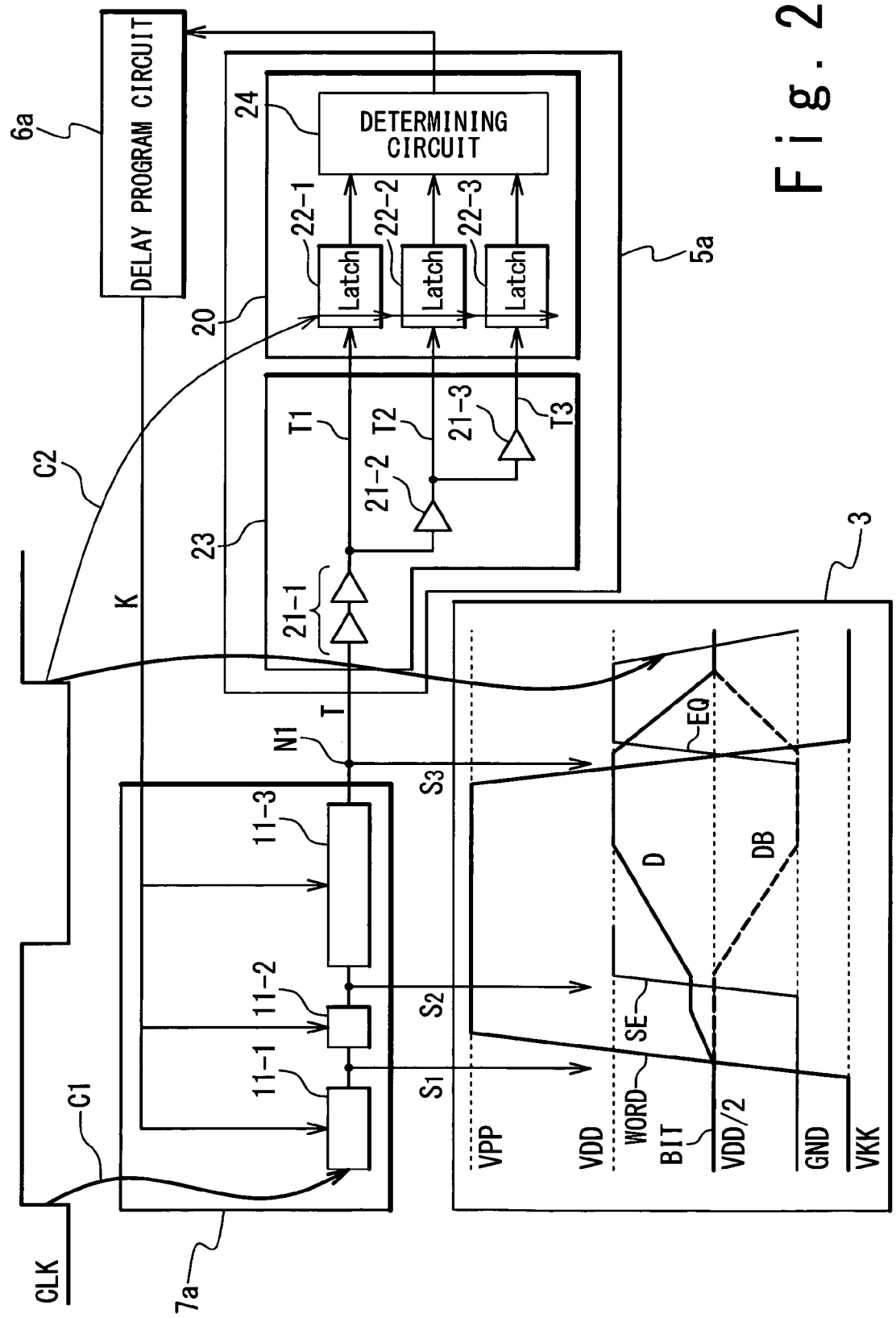
FIG. 2 is a block diagram showing an example of a configuration of a peripheral circuit according to the embodiment of the present invention.

FIG. 2 is a block diagram showing an example of a configuration of the peripheral circuit according to the present embodiment. The peripheral circuit 4 includes the delay section 7a in the control circuit 7, the delay determining section 5a in the BIST circuit 5 and the delay program circuit 6a in the program circuit 6.

The delay section 7a includes a plurality of delay circuits 11 which are serially connected to one another to generate a plurality of timing signals for controlling operations of the respective circuits. A delay amount of the input signal in each delay circuit 11 can be independently set. In an example shown in FIG. 2, the delay circuits 11-1 to 11-3 are included. However, the number of the delay circuits of the present invention is not limited to the example and any number of delay circuits may be included. That is, based on a clock signal C1 as an input signal, the delay circuit 11-1 generates a timing signal S1 by delaying the clock signal C1 according to an internal setting. Then, the timing signal S1 is outputted to the cell array core 3, for example, as a timing signal for the word line WL in the word line driving circuit 31. At the timing, a voltage of the word line WL (WORD) is boosted from VKK to VPP.

Based on the timing signal S1, the delay circuit 11-2 generates a timing signal S2 by delaying the timing signal S1 according to an internal setting. Then, the timing signal S2 is outputted to the cell array core 3, for example, as a sense amplifier enable signal SE (s, /s) and timing signals for the sense amplifier control lines SAP and SAN of the sense amplifier driving circuit 33. At the timing, the voltage BIT of the bit lines Bit (T) and Bit (N) is boosted to VDD and lowered to GND, thereby data is read.

Based on the timing signal S2, the delay circuit 11-3 generates a timing signal S3 by delaying the timing signal S3 according to an internal setting. Then, the timing signal S3 is outputted to the cell array core 3, for example, as a timing signal for the word line WL of the word line driving circuit 31, timing signals for the sense amplifier control lines SAP and SAN and a timing signal (EQ) for the precharge control line PDL of the bit line precharge control circuit 32. At this timing, the voltage of the word line WL (WORD) is lowered from VPP to VKK and the voltage BIT of the bit lines Bit (T) and Bit (N) is precharged to VDD/2.

Figure 4A:
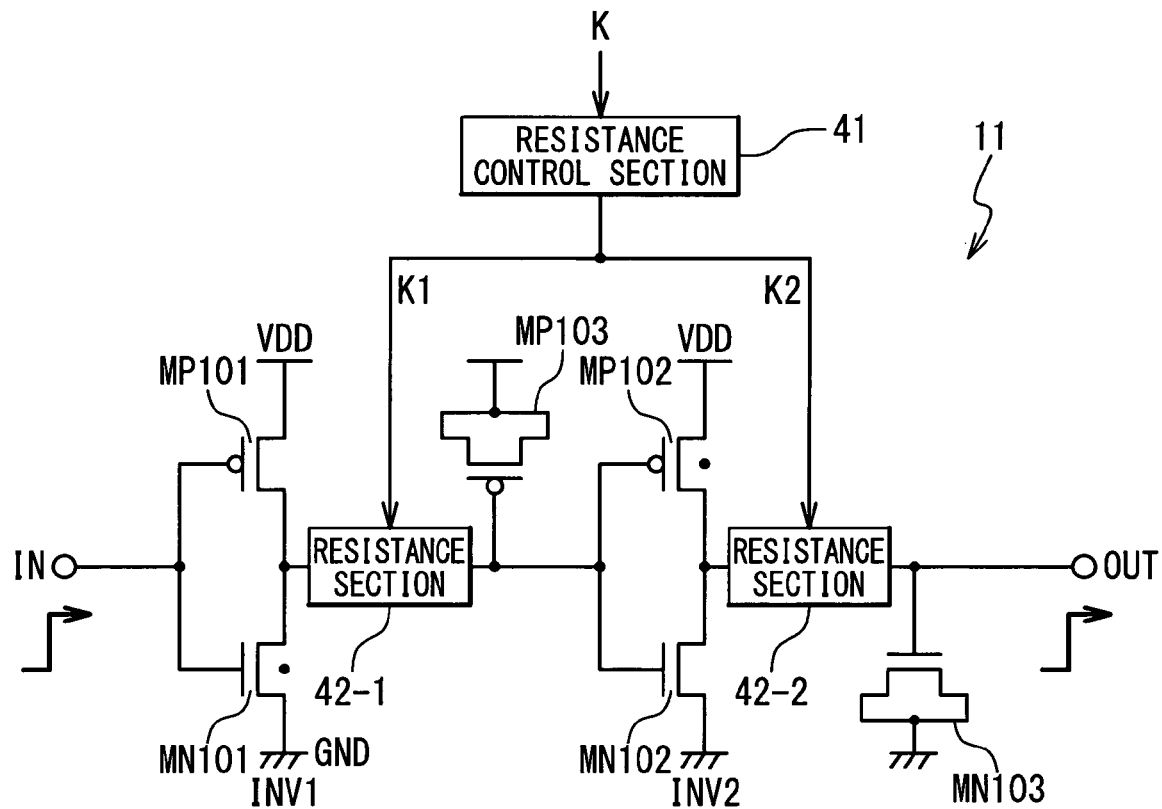
FIGS. 4A and 4B are circuit diagrams showing an example of a delay circuit according to the embodiment of the present invention.

FIG. 4A is a circuit diagram showing an example of the delay circuit according to the present embodiment. As shown in FIG. 4A, the delay circuit 11 has a resistance control section 41, and a circuit in a first stage and a circuit in a second stage which are serially connected to each other.

Based on a delay changing signal K (to be described later) from the delay program circuit 6a, the resistance control section 41 generates a control signal K1 (K11 to K1p) and supplies the control signal K1 to a resistance section 42-1, and generates a control signal K2 (K21 to K2p) and supplies the control signal K2 to the resistance section 42-2. The resistance control section 41 previously has data representing relation between the delay changing signal K and the control signal K1 (K11 to K1p) and control signal K2 (K21 to K2p).

The circuit in the first stage includes a first inverter INV1, the resistance section 42-1 and a MOS capacitor. The first inverter INV1 is a CMOS-type inverter and has a PMOS transistor MP101 and an NMOS transistor MN101. A black dot indicates a transistor of a lower threshold voltage type. A source of the PMOS transistor MP101 is connected to a power supply VDD. A source of the NMOS transistor MN101 is connected to a power supply GND. A common connection of a gate of the NMOS transistor MN101 and a gate of the PMOS transistor MP101 is connected to an input terminal IN and a common connection of a drain of the NMOS transistor MN101 and a drain of the PMOS transistor MP101 is connected to one end of the resistance section 42-1.

Figure 4B:
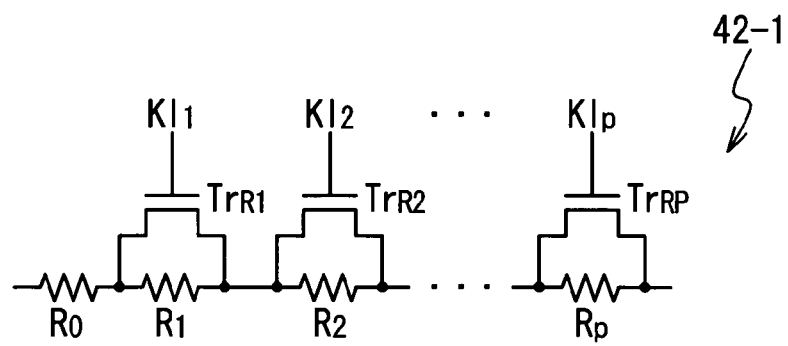

For example, as shown in FIG. 4B, the resistance section 42-1 includes a main resistance R0 and correction resistances R1 to Rp (p is a natural number). The main resistance R0 and the correction resistances R1 to Rp are serially connected to one another. The main resistance R0 determines a main resistance value of the resistance section 42-1. The correction resistances R1 to Rp are parallelly connected to transistors $Tr_{R1}$ to $Tr_{Rp}$, respectively. The control signals K11 to K1p from the resistance control section 41 are supplied to gates of the transistors $Tr_{R1}$ to $Tr_{Rp}$, respectively. The correction resistances R1 to Rp are selected or unselected by the transistors $Tr_{R1}$ to $Tr_{Rp}$ based on the control signals K11 to K1p, respectively. As a result, like R0+(a sum of resistance values of the resistances selected by the transistors), the resistance value of the resistance section 42-1 can be made variable.

The MOS capacitor has a PMOS transistor MP103. A gate of the PMOS transistor MP103 is connected to the other end of the resistance section 42-1, and a source and a drain of the PMOS transistor MP103 are connected to the power supply voltage VDD as a substrate gate potential of the PMOS transistor MP103.

A circuit in the second stage includes a second inverter INV2, the resistance section 42-2 and a MOS capacitor. The second inverter INV2 is a CMOS-type inverter and has a PMOS transistor MP102 and an NMOS transistor MN102. A source of the PMOS transistor MP102 is connected to the power supply VDD. A source of the NMOS transistor MN102 is connected to the power supply GND. A common connection of a gate of the NMOS transistor MN102 and a gate of the PMOS transistor MP102 is connected to a connection point between a gate of the PMOS transistor MP103 and the resistance section 42-1, and a common connection of a drain of the NMOS transistor MN102 and a drain of the PMOS transistor MP102 is connected to one end of the resistance section 42-2.

Since the resistance section 42-2 is identical to the resistance section 42-1 except that the control signals K21 to K2p, not the control signals K11 to K1p are supplied from the resistance control section 41, the description thereof is omitted. As a result, like R0+(a sum of resistance values of the resistances selected by the transistors), the resistance value of the resistance section 42-2 can be made variable. The MOS capacitor has a MOS transistor MN103. A gate of the MOS transistor MN103 is connected to the other end of the resistance section 42-2 and an output terminal OUT and a source and a drain of the MOS transistor MN103 are connected to the ground power supply GND as a substrate gate potential of the NMOS transistor NM103.

In the delay circuit 11, the first inverter INV1 inverts a signal supplied to the input terminal IN and outputs the inverted signal, and then, the second inverter INV2 inverts the output of the first inverter INV1 and outputs the inverted signal. Thereby, a signal delayed from the signal supplied to the input terminal IN, which is in the same phase as the input signal, is outputted from the output terminal OUT. Although FIG. 4A shows two stages of inverters, four or six stages of inverters may be used. When the delay circuit intends to output a signal in an opposite phase to the signal supplied to the input terminal IN, the odd numbers of stages of inverters are used.

The delay circuit 11 is the same as the delay circuit described in Japanese Patent No. 3,866,594 except that the resistance value of the resistance section 42 is variable (the resistance sections 42-1 and 42-2 and the resistance control section 41 are provided). Since the delay circuit integrates a resistance element thereto as a delay element, influence of variation in the power supply voltage VDD and the threshold voltage Vth of the transistors in the delay circuit can be suppressed.

Referring to FIG. 2, the delay determining section 5a has a delay signal generating section 23 and a delay evaluating section 20. The delay signal generating section 23 sequentially delays a last timing signal S outputted from the delay section 7a and generates a plurality of delay signals T. However, the plurality of delay signals T are generated by a plurality of delay units 21 and outputs of the plurality of delay units 21 are the plurality of delay signals T.

In an example shown in FIG. 2, outputs from the three delay units 22-1 to 22-3 are defined as the three delay signals T1 to T3. That is, the delay unit 21-1 delays the timing signal T as the last timing signal S3. The output of the delay unit 21-1 is the delay signal T1. The delay unit 21-2 delays the delay signal T1. The output of the delay unit 21-2 is the delay signal T2. The delay unit 21-3 delays the delay signal T2. The output of the delay unit 21-3 is the delay signal T3. However, the number of the delay units of the present invention is not limited to the example and any number of delay units may be used to generate any number of delay signals.

The delay evaluating section 20 determines a delay state of each of the plurality of delay signals T at a certain time point based on the plurality of delay signals T. That is, the plurality of delay signals T are simultaneously latched by latch circuits 22 at a certain time point and values of the latched signals are determined by a determining circuit 24.

In an example shown in FIG. 2, the three delay signals T1 to T3 are simultaneously latched by latch circuits 22-1 to 22-3, respectively, at the clock signal C2 (a clock signal after 1 clock from C1) and values of the latched signals are outputted to the determining circuit 24. For example, when the timing signal T(S3) changes from Low to High at a certain time, the delay signal T1 changes from Low to High after a delay amount of the delay unit 21-1 from the timing signal T. The delay signal T2 changes from Low to High after a delay amount of the delay unit 21-2 from the delay signal T1. The delay signal T changes from Low to High after a delay amount of the delay unit 21-3 from the delay signal T2.

At this time, depending on timing when the latch circuits 22-1 to 22-3 are simultaneously operated, the following four cases are possible: (1) any of the delay signals T1 to T3 does not change to High, (2) only the delay signal T1 changes to High, (3) the delay signals T1 and T2 change to High, and (4) all of the delay signals T1 to T3 change to High.

The determining circuit 24 outputs a data on the delay state, that is, in the above-mentioned example, delay signals (T1, T2, T3)=delay states (0, 0, 0) in the above-mentioned case (1), delay signals (T1, T2, T3)=delay states (1, 0, 0) in the above-mentioned case (2), delay signals (T1, T2, T3)=delay states (1, 1, 0) in the above-mentioned case (3), and delay signals (T1, T2, T3)=delay states (1, 1, 1) in the above-mentioned case (4) to the program circuit 6a.

Based on the data on the delay state outputted from the determining circuit 24, the delay program circuit 6a generates the delay changing signal K for changing internal setting of the delay section 7 which is previously set according to the delay state to an optimum value, and outputs the delay changing signal K to each delay circuit 11 of the delay section 7a. The delay program circuit 6a previously has data representing relation between the data on the delay state and the outputted delay changing signal K.

The delay changing signal K is set based on a following concept.

The above-mentioned plural cases ((1) to (4)) occur due to variation in timing of the timing signal S3 (T). For example, in case where the timing in the above-mentioned case (2) is optimum in design, the timing of the timing signal S3 (T) is too early in the above-mentioned case (1), the timing of the timing signal S3 (T) is too late in the above-mentioned case (3) and the timing of the timing signal S3 (T) is too later in the above-mentioned case (4) than the timing in the case (3).

It could be understood that such variation in the timing of the timing signal S3 (T) occurs due to variation in the delay amounts of the delay circuits 11-1 to 11-3, which is caused by influence of manufacturing variation. Especially, in the delay circuit using the resistance elements as shown in FIGS. 4A and 4B, since influence of the power supply voltage VDD and influence of the threshold voltage Vth of the transistors are suppressed, influence of manufacturing variation is large. Accordingly, by adjusting the delay amount of each of the delay circuits 11-1 to 11-3 depending on each of the plurality of cases, the timing of the timing signal S3 (T) can be optimized (for example, in the above-mentioned case (2)). For example, in the above-mentioned case (1), a delay amount of each of the delay circuits 11-1 to 11-3 may be decreased; in the above-mentioned case (3), the delay amount of each of the delay circuits 11-1 to 11-3 may be increased; and in the above-mentioned case (4), the delay amount of each of the delay circuits 11-1 to 11-3 may be made larger than that in the case (3). Specifically, in the above-mentioned case (1), the delay changing signal K becomes a signal for decreasing the delay amount of each of the delay circuits 11-1 to 11-3. An extent of decrease is preset in the delay program circuit 6a. In the above-mentioned case (3), the delay changing signal K becomes a signal for increasing the delay amount of each of the delay circuits 11-1 to 11-3. An extent of increase is preset in the delay program circuit 6a. In the above-mentioned case (4), the delay changing signal K becomes a signal for making the delay amount of each of the delay circuits 11-1 to 11-3 larger than that in the above-mentioned case (3). The extent of increase is preset in the delay program circuit 6a.

Based on the delay changing signal K, each of the delay circuits 11-1 to 11-3 of the delay section 7a changes the resistance sections 42-1 and 42-2 in response to the control signals K11 to K1$p$ and the control signals K21 to K2$p$, which are generated by the resistance control section 41. Thus, the delay amount of each of the delay circuits 11-1 to 11-3 is changed.

It could be understood that the delay circuits 11-1 to 11-3 are influenced substantially equally by the manufacturing variation of the semiconductor device. Therefore, it could be understood that variation in the timing signal S3 occurs because each of the delay circuits 11-1 to 11-3 has similar manufacturing variation. In the present embodiment, by changing the delay amount of each of the delay circuits 11-1 to 11-3 as described above, variation in the timing of the timing signals S1 to S3 (T) caused by variation in the delay amounts of the delay circuits 11-1 to 11-3 due to influence of manufacturing variation can be prevented.

According to the present invention, as described above, a self-test circuit and an adjusting circuit (the delay determining section 5a and the delay program circuit 6a) are provided to adjust variation in device characteristics of the delay circuits due to manufacturing variation. That is, the test circuit (delay determining section 5a) determines a state of change of the delay time of the delay circuit, which is caused by influence of variations in the transistor elements and the resistance elements. The result (the delay amount is large/small) is fed back to the delay circuit (the delay circuits 11-1 to 11-3) by the adjusting circuit (the delay program circuit 6a) (a delay path is shortened/lengthened). In this manner, shift in the internal timing (timing signals S1 to S3) can be corrected.

The feedback adjustment amount can be stored in a program circuit (the delay program circuit 6a). The data stored in the program circuit 6a can be fetched into each of the delay circuits 11-1 to 11-3 each time an apparatus including the semiconductor device 1 is powered on. As a result, the delay circuits 11-1 to 11-3 can be adjusted in an initial test during manufacturing of the semiconductor device 1 as well as during use of the semiconductor device 1.

When a memory area of the cell array core 3 is large, an internal timing signal T' from a furthest cell array core with smallest internal margin (the cell array core 3-1 in FIG. 1) can be used for determination. Thus, even when the memory area of the cell array core 3 is large, the delay circuit can be adjusted more properly.

Figure 5:
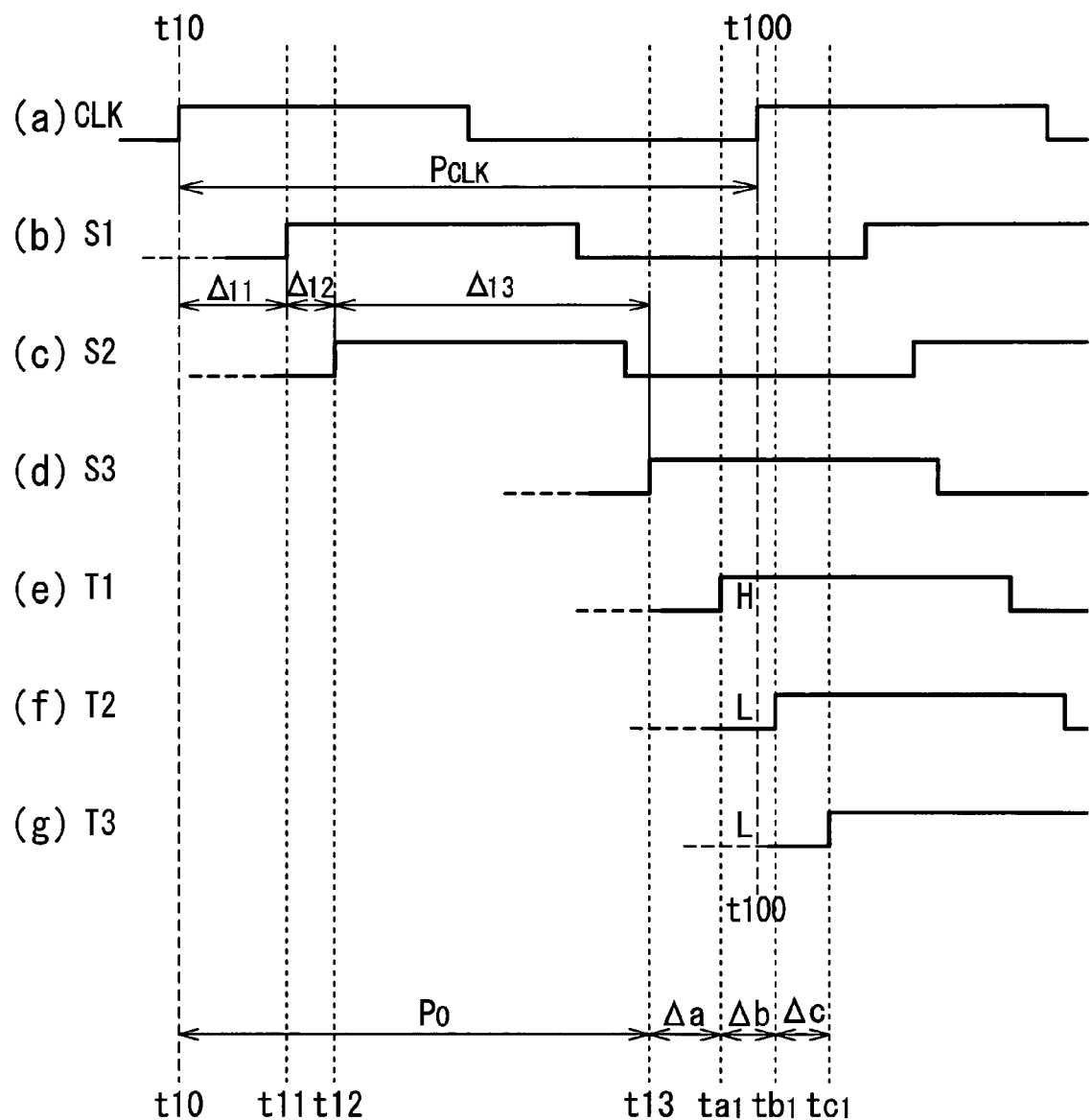
FIG. 5 is a timing chart of a timing adjusting method of the semiconductor device according to the embodiment of the present invention.
Figure 6:
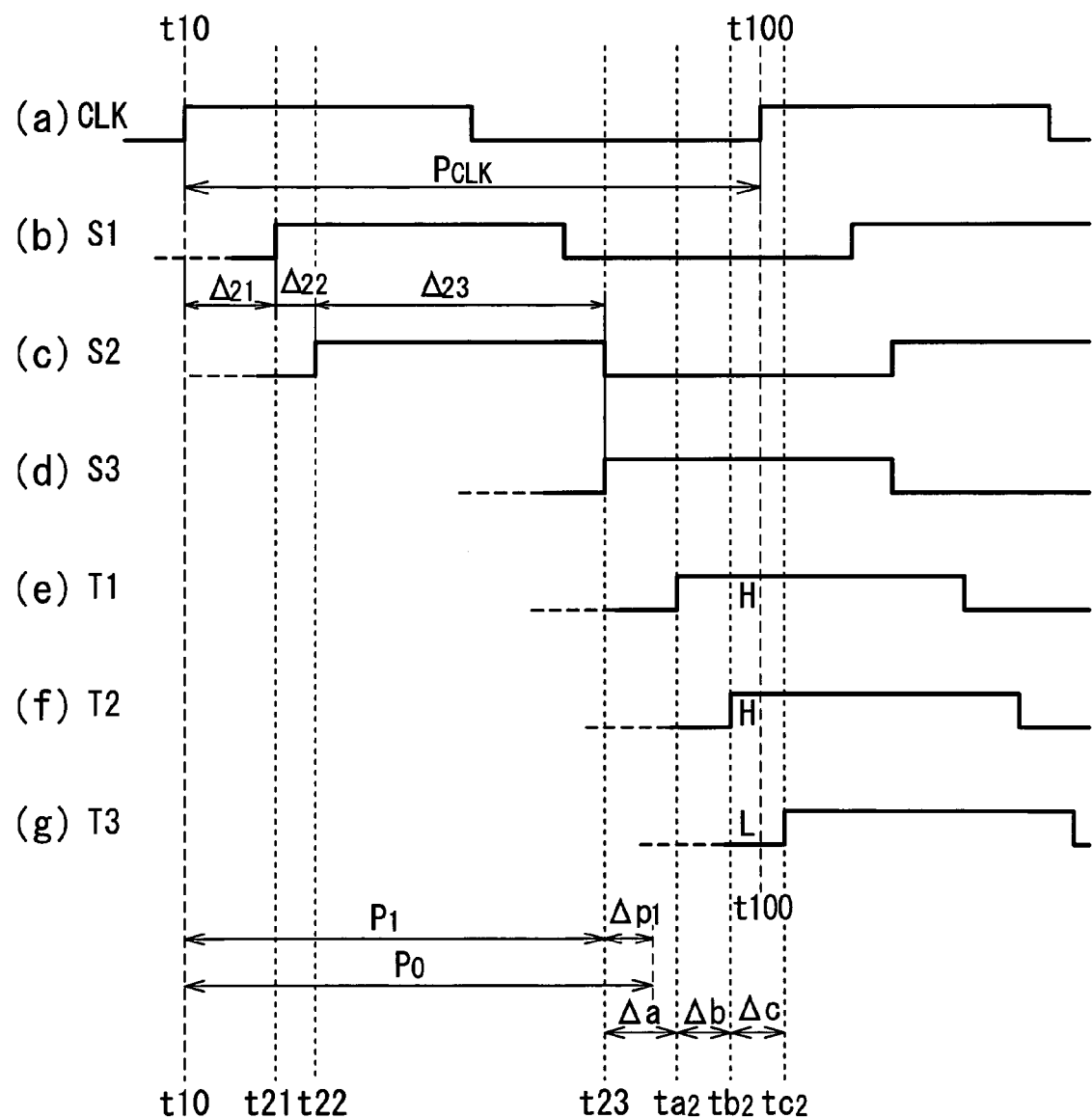
FIG. 6 is a timing chart of the timing adjusting method of the semiconductor device according to the embodiment of the present invention.
Figure 7:
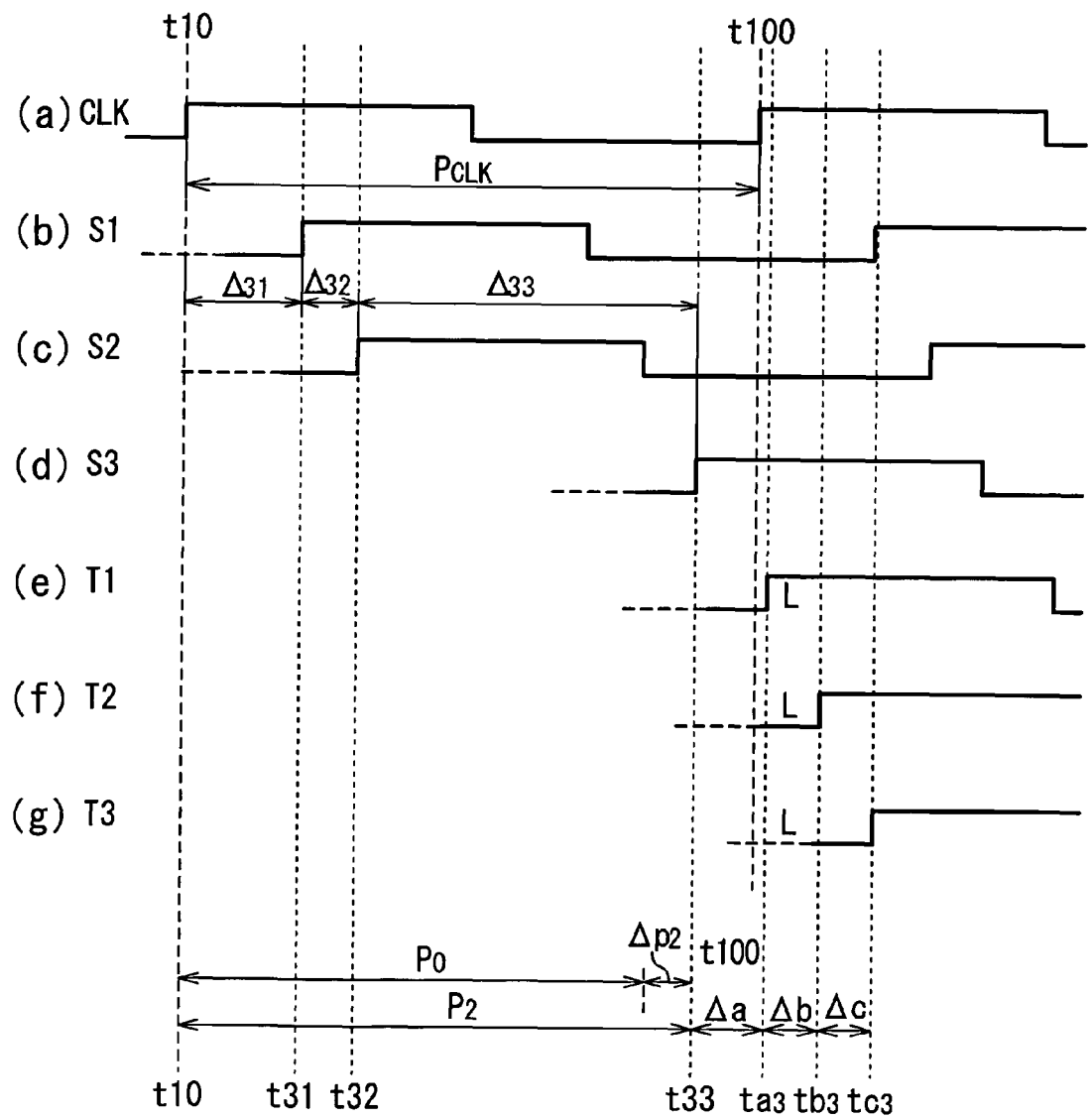
FIG. 7 is a timing chart of the timing adjusting method of the semiconductor device according to the embodiment of the present invention.

Next, a timing adjusting method of the semiconductor device according to the present embodiment (an operation of the semiconductor device) will be described with reference to mainly FIG. 2 and FIGS. 5 to 7. FIGS. 5 to 7 show timing charts in the timing adjusting method of the semiconductor device according to the present embodiment. The (a) portions of FIGS. 5 to 7 show a clock signal CLK, the (b) portion of FIGS. 5 to 7 show the timing signal S1, the (c) portion of FIGS. 5 to 7 show the timing signal S2, and the (d) of FIGS. 5 to 7 show the timing signal S3. The (e) portions of FIGS. 5 to 7 show the delay signal T1, the (f) portions of FIGS. 5 to 7 show the delay signal T2, and the (g) portions of FIGS. 5 to 7 show the delay signal T3. Here, the case of three timing signals (S1 to S3) and three delay signals (T1 to T3) will be described.

First, referring to FIG. 5, a case where the timing signals S1 to S3 are optimum will be described. As shown in FIG. 5, the clock signal CLK is supplied to the delay section 7a of the control circuit 7. At time t10, the clock signal CLK is set to a High state (a first clock C1). In response to this, at time t11, after a lapse of a time period 11, the timing signal S1 outputted from the delay circuit 11-1 is set to a High state. The High state of the timing signal S1 is transmitted to the cell array core 3 and accordingly, a predetermined operation is performed.

As described above, at time t11, the timing signal S1 is set to a High state. In response to this, at time t12, after a lapse of a time period 12, the timing signal S2 outputted from the delay circuit 11-2 is set to a High state. The High state of the timing signal S2 is transmitted to the cell array core 3, and accordingly, a predetermined operation is performed.

As described above, at time t12, the timing signal S2 is set to the High state. In response to this, at time t13, after a lapse of a time period 13, the timing signal S3 outputted from the delay circuit 11-3 is set to a High state. The High state of the timing signal S3 is transmitted to the cell array core 3, and accordingly, a predetermined operation is performed.

The timing signal T as the timing signal S3 is supplied to the delay determining section 5a. At time t13, the timing signal S3 (the timing signal T) is set to the High state. In response to this, at time ta1, after a lapse of a time period a, the delay signal T1 outputted from the delay unit 21-1 is set to a High state. The High state of the delay signal T1 is transmitted to the latch circuit 22-1.

As described above, at time ta1, the delay signal T1 is set to the High state. In response to this, at time tb1, after a lapse of a time period b, the delay signal T2 outputted from the delay unit 21-2 is set to a High state. The High state of the delay signal T2 is transmitted to the latch circuit 22-2.

As described above, at time tb1, the delay signal T2 is set to the High state. In response to this, at time tc1, after a lapse of a time period c, the delay signal T3 outputted from the delay unit 21-3 is set to a High state. The High state of the delay signal T3 is transmitted to the latch circuit 22-3.

Independently of the states of the delay signals T1 to T3, at time t100, the clock signal CLK is set to the High state after the first clock C1 (second clock C2). In response to this, all of the latch circuits 22-1 to 22-3 latch values of the delay signals T1 to T3 at the time point. As shown in FIG. 5, the state of the delay signals (T1, T2, T3) at time t100 is (H, L, L), that is, (1, 0, 0). Accordingly, the determining circuit 24 outputs (1, 0, 0) as the states of the delay signals (T1, T2, T3) to the delay program circuit 6a.

When the states of the delay signals (T1, T2, T3) are (1, 0, 0), the delay program circuit 6a outputs a preset delay changing signal K to the delay section 7a. In the delay section 7a, each of the delay circuits 11-1 to 11-3 adjusts the delay amount according to the delay changing signal K. In this case, since the delay amount of the delay section 7a is optimum, no delay changing signal K is outputted. Thus, the delay amount of the delay section 7a is not changed and the optimum value is maintained.

Next, referring to FIG. 6, a case where the timing is early, as compared to the case where the timing signals S1 to S3 are optimum will be described. FIG. 6 shows a case where a period P1 from t10 (the first clock C1) to t23 (the timing signal S3) is smaller than a period P0 from t10 (the first clock C1) to t13 (the timing signal S3) in FIG. 5 by p1.

As shown in FIG. 6, the clock signal CLK is supplied to the delay section 7a of the control circuit 7. At time t10, the clock signal CLK is set to the High state (the first clock C1). In response to this, at time t21, after a lapse of a time period 21, the timing signal S1 outputted from the delay circuit 11-1 is set to the High state. The High state of the timing signal S1 is transmitted to the cell array core 3, and accordingly, a predetermined operation is performed.

As described above, at time t21, the timing signal S1 is set to the High state. In response to this, at time t22, after a lapse of a time period 22, the timing signal S2 outputted from the delay circuit 11-2 is set to the High state. The High state of the timing signal S2 is transmitted to the cell array core 3, and accordingly, a predetermined operation is performed.

As described above, at time t22, the timing signal S2 is set to the High state. In response to this, at time t23, after a lapse of a time period 23, the timing signal S3 outputted from the delay circuit 11-3 is set to the High state. The High state of the timing signal S3 is transmitted to the cell array core 3, and accordingly, a predetermined operation is performed.

The timing signal T as the timing signal S3 is supplied to the delay determining section 5a.

At time t23, the timing signal S3 (the timing signal T) is set to the High state. In response to this, at time ta2, after a lapse of a time period a, the delay signal T1 outputted from the delay unit 21-1 is set to the High state. The High state of the delay signal T1 is transmitted to the latch circuit 22-1.

As described above, at time ta2, the delay signal T1 is set to the High state. In response to this, at time tb2, after a lapse of a time period b, the delay signal T2 outputted from the delay unit 21-2 is set to the High state. The High state of the delay signal T2 is transmitted to the latch circuit 22-2.

As described above, at time tb2, the delay signal T2 is set to the High state. In response to this, at time tc2, after a lapse of a time period c, the delay signal T3 outputted from the delay unit 21-3 is set to the High state. The High state of the delay signal T3 is transmitted to the latch circuit 22-3.

Independently of the states of the delay signals T1 to T3, at time t100, the clock signal CLK is set to the High state after the first clock C1 (the second clock C2). In response to this, all of the latch circuits 22-1 to 22-3 latch values of the delay signals T1 to T3 at this time point. As shown in FIG. 6, the states of the delay signals (T1, T2, T3) at time t100 are (H, H, L), that is, (1, 1, 0). Accordingly, the determining circuit 24 outputs (1, 1, 0) as the states of the delay signals (T1, T2, T3) to the delay program circuit 6a.

When the states of the delay signals (T1, T2, T3) are (1, 1, 0), the delay program circuit 6a outputs a preset delay changing signal K to the delay section 7a. In the delay section 7a, each of the delay circuits 11-1 to 11-3 adjusts the delay amount according to the delay changing signal K. In this case, since the delay amount of the delay section 7a is an earlier value than an optimum value, the delay changing signal K for increasing the delay amount of each of the delay circuits 11-1 to 11-3 of the delay section 7a is outputted. Thus, the delay amount of each of the delay circuits 11-1 to 11-3 is increased to the optimum amount, resulting in the timing chart as shown in FIG. 5. Furthermore, as the states of delay signals before the change, (1, 1, 0) are stored in the delay program circuit 6a.

In case of manufacturing variation in the semiconductor devices 1, as shown in FIG. 6, a following relationship:

21<11, 22<12 and 23<13 in a similar proportion can be assumed. That is, the timing signals S1, S2, S3 are set to the High state earlier, as compared to the optimum case. In such a case, as described above, the delay amount of each of the delay circuits 11-1 to 11-3 can be changed to the optimum amount according to the delay changing signal K.

In addition, even when there is a manufacturing variation in individual devices and a following relationship holds: 21+22+23<11+12+13, although not 21<11, 22<12 and 23<13, the timing signal can be closer to the optimum amount by changing the delay amount of each of the delay circuits 11-1 to 11-3 according to the delay changing signal K, as in the above-mentioned case.

Next, referring to FIG. 7, a case where the timing is later, as compared to a case where the timing signals S1 to S3 are optimum will be described. In FIG. 7, a period P2 from t10 (the first clock C1) to t33 (the timing signal S3) is larger than the period from t10 (first clock C1) to t13 (timing signal S3) in FIG. 5 by p2. As shown in FIG. 7, the clock signal CLK is supplied to the delay section 7a of the control circuit 7. At time t10, the clock signal CLK is set to the High state (the first clock C1). In response to this, at time t31, after a lapse of a time period 31, the timing signal S1 outputted from the delay circuit 11-1 is set to the High state. The High state of the timing signal S1 is transmitted to the cell array core 3, and accordingly, a predetermined operation is performed.

As described above, at time t31, the timing signal S1 is set to the High state. In response to this, at time t32, after a lapse of a time period 32, the timing signal S2 outputted from the delay circuit 11-2 is set to the High state. The High state of the timing signal S2 is transmitted to the cell array core 3, and accordingly, a predetermined operation is performed. As described above, at time t32, the timing signal S2 is set to the High state. In response to this, at time t33, after a lapse of a time period 33, the timing signal S3 outputted from the delay circuit 11-3 is set to the High state. The High state of the timing signal S3 is transmitted to the cell array core 3, and accordingly, a predetermined operation is performed.

The timing signal T as the timing signal S3 is supplied to the delay determining section 5a. At time t33, the timing signal S3 (the timing signal T) is set to the High state. In response to this, at time ta3, after a lapse of a time period a, the delay signal T1 outputted from the delay unit 21-1 is set to the High state. The High state of the delay signal T1 is transmitted to the latch circuit 22-1.

As described above, at time ta3, the delay signal T1 is set to the High state. In response to this, at time tb3, after a lapse of a time period b, the delay signal T2 outputted from the delay unit 21-2 is set to the High state. The High state of the delay signal T2 is transmitted to the latch circuit 22-2. Also, as described above, at time tb3, the delay signal T2 is set to the High state. In response to this, at time tc3, after a lapse of a time period c, the delay signal T3 outputted from the delay unit 21-3 is set to the High state. The High state of the delay signal T3 is transmitted to the latch circuit 22-3.

Independently of the state of the delay signals T1 to T3, at time t100, the clock signal CLK is set to the High state after the first clock C1 (the second clock C2). In response to this, all of the latch circuits 22-1 to 22-3 latch values of the delay signals T1 to T3 at this time point. As shown in FIG. 7, the states of the delay signals (T1, T2, T3) at time t100 are (L, L, L), that is, (0, 0, 0). Accordingly, the determining circuit 24 outputs (0, 0, 0) as the state of the delay signals (T1, T2, T3) to the delay program circuit 6a.

When the state of the delay signals (T1, T2, T3) are (0, 0, 0), the delay program circuit 6a outputs a preset delay changing signal K to the delay section 7a. In the delay section 7a, each of the delay circuits 11-1 to 11-3 adjusts the delay amount based on the delay changing signal K. In this case, since the delay amount of the delay section 7a is greater than the optimum amount, the delay changing signal K for decreasing the delay amount of each of the delay circuits 11-1 to 11-3 of the delay section 7a is outputted. Thereby, the delay amount of each of the delay circuits 11-1 to 11-3 is decreased to the optimum amount, resulting in the timing charts as shown in FIG. 5. Furthermore, as the states of delay signals before change, the (0, 0, 0) are stored in the delay program circuit 6a.

In case of a manufacturing variation in the semiconductor devices 1, the following relationship: 31>11, 32>12 and 33>T13 in a similar proportion can be assumed as shown in FIG. 7. That is, the timing signals S1, S2, S3 are set to the High state later as compared to the optimum case. In such a case, as described above, the delay amount of each of the delay circuits 11-1 to 11-3 can be changed to the optimum amount according to the delay changing signal K. In addition, even when there is the manufacturing variation in individual devices and the following relationship holds: 31+32+33>11+12+13, although not 31>11, 32>12 and 33>13, the timing signal can be closer to the optimum amount by changing the delay amount of each of the delay circuits 11-1 to 11-3 according to the delay changing signal K, as in the above-mentioned case.

As described above, the timing adjusting method of the semiconductor device according to the present embodiment is performed.

However, the period P0 in FIG. 5, the period P1 in FIG. 6 and the period P2 in FIG. 7 each are, for example, 90% or more, mostly 95% or more of a 1 clock period $P_{CLK}$ (the period from the t10 (the first clock C1) to t100 (the second clock C2)). On the other hand, the delay period of the delay signal (a+b+c) is, for example, 10% or less, mostly 5% or less to the clock period $P_{CLK}$. Therefore, as compared to the delay section 7a (the delay circuits 11-1 to 11-3), the manufacturing variation in the delay determining section 5a (the delay units 21-1 to 21-3) can be ignored.

In addition, preferably, elements of each of the delay units 21-1 to 21-3 which cause a delay are identical to each other, and more preferably, the elements are located at positions closer to each other. As a result, since the manufacturing variation in the delay units 21-1 to 21-3 need not be considered, more accurate evaluation can be achieved.

Furthermore, elements in the delay circuits 11-1 to 11-3 and the delay units 21-1 to 21-3 which cause a delay are formed to have an identical configuration to each other. As a result, since the manufacturing variation in the delay circuits 11-1 to 11-3 and the delay units 21-1 to 21-3 need not be considered, more accurate evaluation can be achieved.

In the above-mentioned embodiment, when the states of the delay signals (T1, T2, T3) are (0, 0, 0) as shown in FIG. 7, the delay amount may not be changed to the optimum amount through once adjustment because the delay amount is too large. In such a case, when the states of the delay signals (T1, T2, T3) are (0, 0, 0), it can be set to make a re-adjustment. Similarly, although not shown, when the delay signals (T1, T2, T3) are (1, 1, 1), the delay amount may not be changed to the optimum amount through once adjustment because the delay amount is too small. In such a case, when the delay signals (T1, T2, T3) are (1, 1, 1), it can be set to make a re-adjustment.

Figure 8:
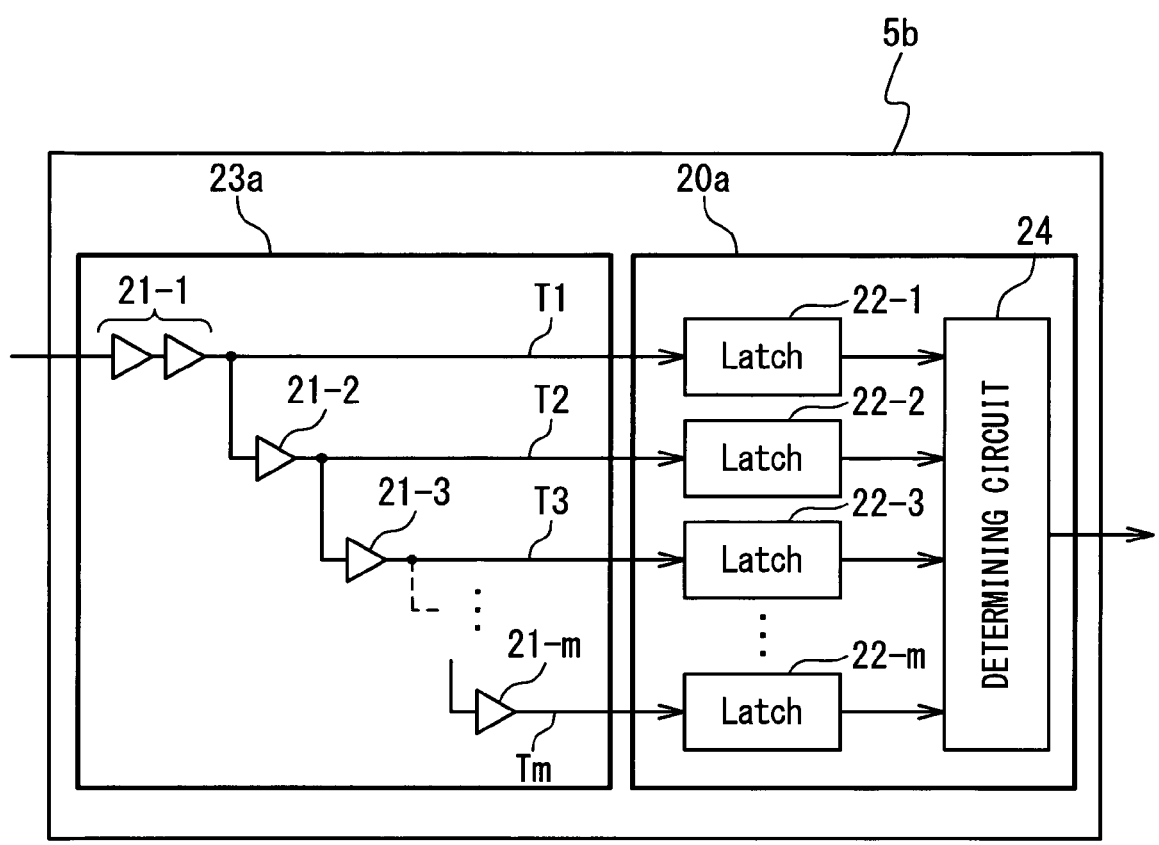
FIG. 8 is a block diagram showing another example of configuration of a delay determining part according to the embodiment of the present invention.

Like a case where the states of the delay signals (T1, T2, T3) are (0, 0, 0) or (1, 1, 1), to deal with a case where it is difficult to specify the delay amount at evaluation, the number of the delay units 21 may be further increased so as to cover the extent of the manufacturing variation. FIG. 8 shows such a example.

FIG. 8 is a block diagram showing another example of the configuration of the delay determining section according to the present embodiment. The delay determining section 5b has a delay signal generating section 23a and a delay evaluating section 20a. The delay signal generating section 23a sequentially delays the last timing signal S outputted from the delay section 7a by using a plurality of delay units 21-1 to 21-m and generates a plurality of delay signals T1 to Tm. The delay evaluating section 20a simultaneously latches the plurality of delay signals T1 to Tm at a certain time point (for example, the second clock C2) by the latch circuits 22-1 to 22-m, respectively, and determines values of the latched signals by the determining circuit 24.

A variation of the delay amount (delay time) for the period PO shown in FIG. 5 due to the manufacturing variation (for example, p1, p2) is about ±10%. Accordingly, the number (m) of delay units and the respective delay times (1, 2, ..., m) may be set so that a sum of delay times 1 to m in the delay units 21-1 to 21-m (=1+2+ ... +m) may is equivalent to the above-mentioned ±10%.

In this case, the delay states of the delay signals (T1, T2, ..., Tm-1, Tm) grasped by the determining circuit 24 can fall within the scope of (1, 1, ..., 1, 0) to (1, 0, ..., 0, 0). In this case, the state of the delay amount can be determined depending on a position of boundary between a row of "1" and a row of "0". That is, the delay state (the delay amount is large/small and its extent) can be grasped in once evaluation. For example, when the number of "1" is substantially equal to the number of "0", the number is assumed to be an optimum amount. When the number of "1" is greater than the optimum amount, the delay amount can be deemed to be small (the delay path is short) and when the number of "0" is greater than the optimum amount, the delay amount can be deemed to be large (the delay path is long). Furthermore, the delay amount (length of the delay path relative to the optimum amount) can be obtained depending on the number of "1" or "0" in these cases.

At this time, the delay program circuit 6a previously stores data representing the delay changing signal K when any one of a plurality of delay states (1, 1, ..., 0, 0) to (1, 0, ..., 0, 0) is shifted to another delay state. As a result, the delay amount of the delay section 7a (a plurality of delay circuits 11) can be changed to a desired amount (for example, the optimum amount) through only once adjustment by the delay program circuit 6a based on the delay state (the delay amount is large/small and its extent) properly grasped through once evaluation. That is, the delay amount can be brought extremely close to a specific desired amount rather than merely fall within an allowable range. In this case, the desired amount is not necessarily the optimum amount and can be made larger or smaller than the optimum amount depending on the state of the cell array core 3.

At this time, it is preferable that elements of the delay units 21-1 to 21-m which cause a delay amount are formed to have an identical configuration. Thus, shift from any one of the plurality of delay states (1, 1, ..., 1, 0) to (1, 0, ..., 0, 0) to another delay state can be regarded as a difference between both the delay states in the number of "1" (or the number of "0"). Thus, the amount of data stored in the delay program circuit 6a can be reduced.

It should be noted that the delay circuit 11 (FIG. 4A) is merely an example and may have another configuration as long as it can suppress influence of a variation of the power supply voltage VDD and a variation of the threshold voltage Vth of the transistors in the delay circuit. For example, a delay circuit incorporating resistance elements as delay elements thereinto as shown in FIG. 4B may be adopted.

Figure 9:
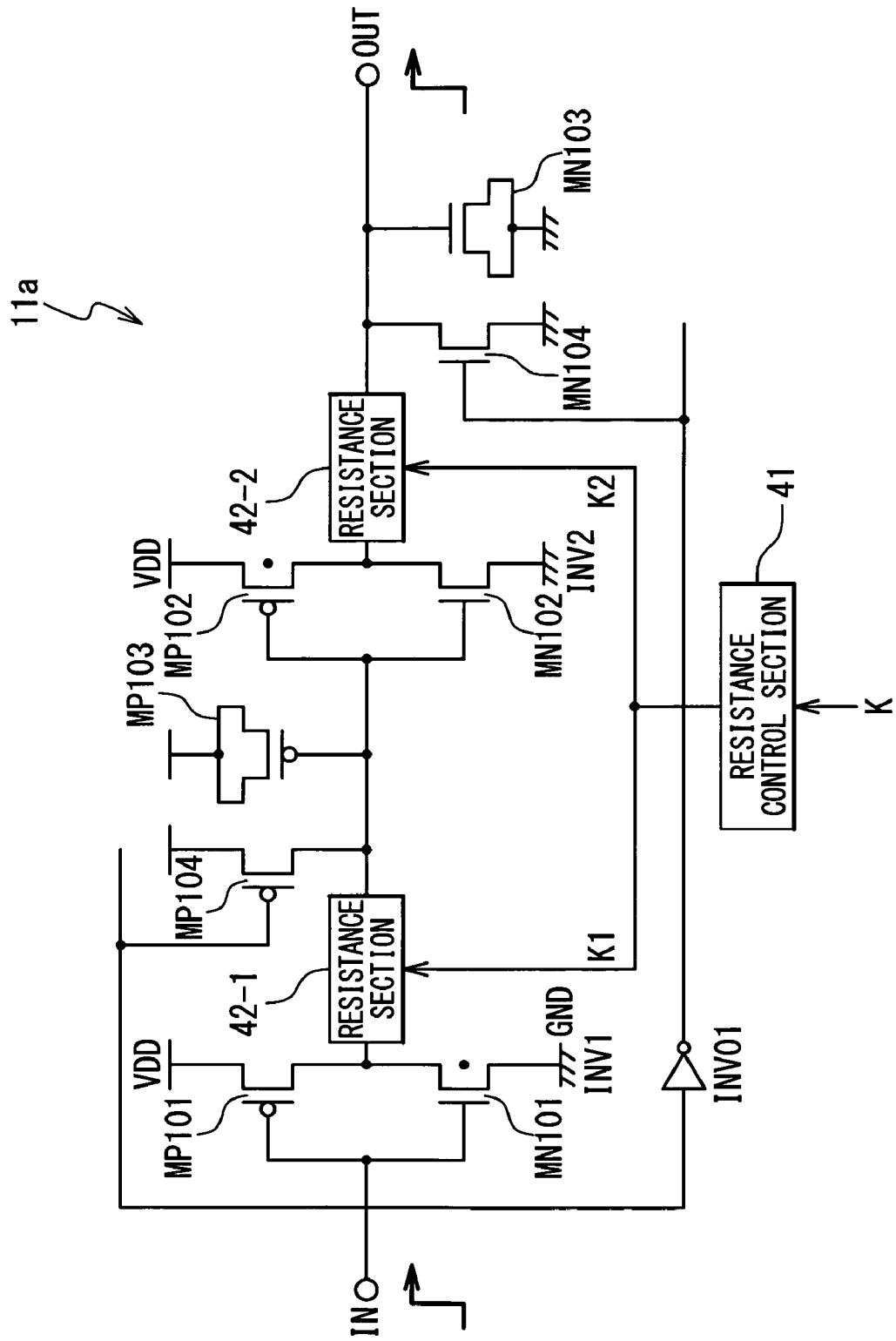
FIG. 9 is a circuit diagram showing another example of the delay circuit according to the embodiment of the present invention.

FIG. 9 is a circuit diagram showing another example of the delay circuit according to the present embodiment.

In FIG. 9, the same reference numerals are assigned to the same components as those in FIG. 4A. A delay circuit 11a is different from the delay circuit 11 in FIG. 4A in that a reset circuit is provided separately from the delay path. That is, referring to FIG. 9, the delay circuit 11a further includes a PMOS transistor MP104, an inverter INV01 and an NMOS transistor MN104. The PMOS transistor MP104 has a source connected to the power supply VDD, a drain connected to a connection node between the resistance section 42-1 and the gate of the MOS capacitor MP103, and a gate connected with an input signal. The inverter INV01 receives the input signal and outputs an inverted signal thereof. The NMOS transistor MN104 has a source connected to GND, a drain connected to a connection node between the resistance section 42-2 and the gate of the MOS capacitor MN103 and a gate connected to an output signal of the inverter INV01.

Figure 10:
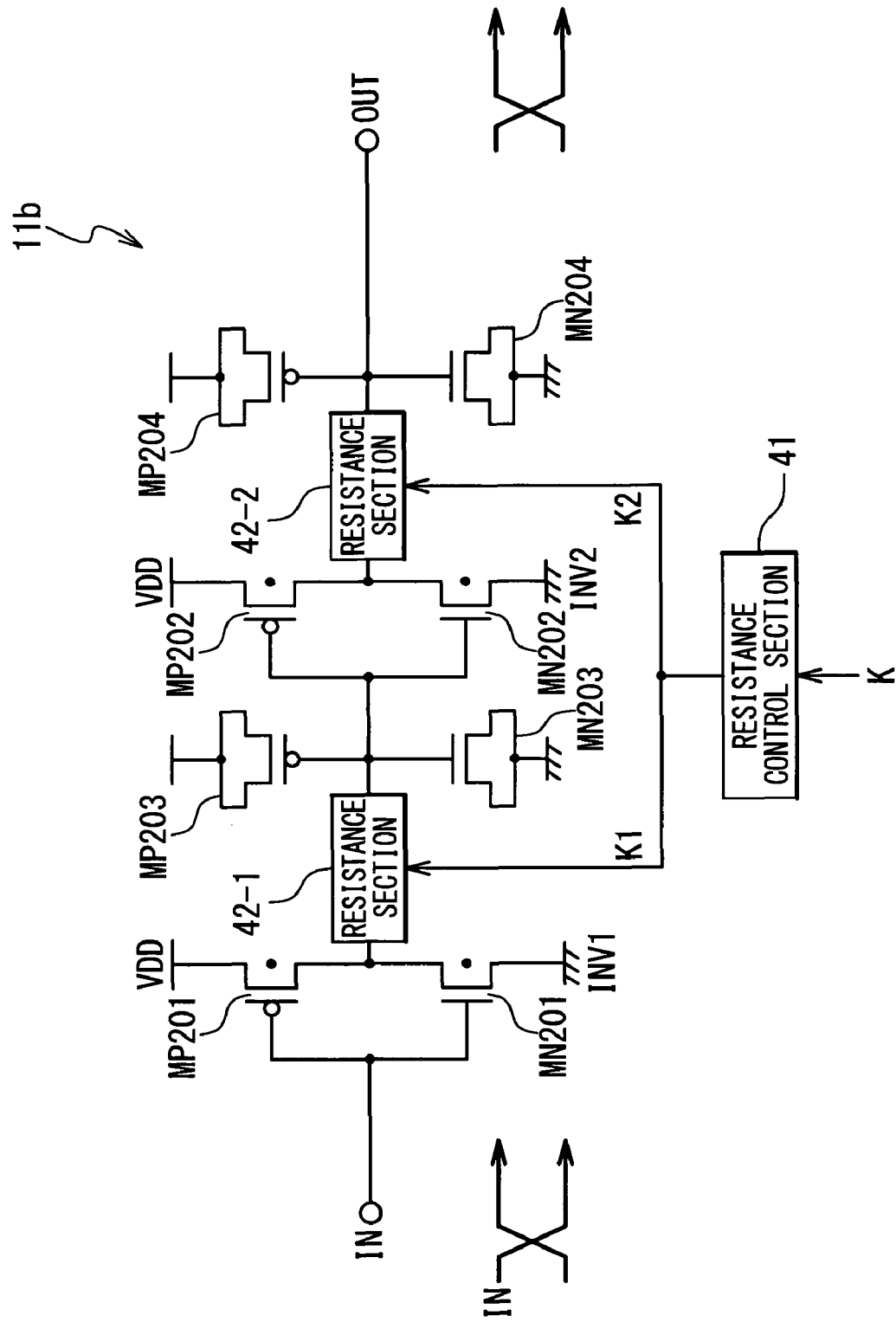
FIG. 10 is a circuit diagram showing still another example of the delay circuit according to the embodiment of the present invention.

FIG. 10 is a circuit diagram showing still another example of the delay circuit according to the present embodiment. In FIG. 10, the delay circuit 11b includes the first inverter INV1, a PMOS capacitor MP203, an NMOS capacitor MN203, the second inverter INV2, a PMOS capacitor MP204 and an NMOS capacitor NM204. The PMOS capacitor MP203 is connected between one end of the resistance section 42-1, the other end of which is connected to an output terminal of the first inverter INV1, and the power supply VDD. The NMOS capacitor MN203 is connected between the one end of the resistance section 42-1 and the ground power supply GND. The PMOS capacitor MP204 is connected between one end of the resistance section 42-2, the other end of which is connected to an output terminal of the second inverter INV2, and the power supply VDD. The NMOS capacitor NM204 is connected between the one end of the resistance section 42-2 and the ground power supply GND.

These delay circuits 11a and 11b are identical to the delay circuit described in Japanese Patent No. 3,866,594 except that the resistance value of the resistance section is variable (the resistance sections 42-1 and 42-2 and the resistance control section 41 are provided). Since these delay circuits incorporate the resistance elements as the delay element thereinto, influence of variation in the power supply voltage VDD and variation of the threshold voltage Vth of the transistors in the delay circuits can be suppressed.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A semiconductor device comprising:
   a delaying circuit configured to delay an input signal based on an internal setting data to output as a timing signal;
   a delay determining section configured to determine a delay state of each of a plurality of delay signals obtained by delaying the timing signal, based on states of the plurality of delay signals; and
   a program section configured to change the internal setting data based on the delay state.

2. The semiconductor device according to claim 1, wherein said delay determining section comprises:

a delay signal generating section configured to sequentially delay said timing signal to generate the plurality of delay signals; and a delay evaluating section configured to determine the delay state of each of the plurality of delay signals based on the plurality of delay signals.

3. The semiconductor device according to claim 2, wherein said delay signal generating section comprises n delay units (n is a natural number), and a first one of said n delay units delays the timing signal to generate a first delay signal, and an $i^{th}$ one of said n delay units (i is an integer satisfying 2 i n) delays an $(i-1)^{th}$ delay signal to generate an $i^{th}$ delay signal.

4. The semiconductor device according to claim 3, wherein said delay evaluating section determines, as the delay state, an output state of each of said n delay units at predetermined timing.

5. The semiconductor device according to claim 3, wherein components to delay a signal are substantially same among said n delay units.

6. The semiconductor device according to claim 5, wherein said components are substantially same among said n delay units and said delaying circuit.

7. The semiconductor device according to claim 1, wherein said delaying circuit comprises a resistance device to delay the input signal.

8. The semiconductor device according to claim 1, wherein said program section further changes the internal setting data based on the delay state accomplished after change of the internal setting data, such that the timing signal approaches an optimum signal.

9. A method of adjusting timing of a semiconductor device, comprising:

delaying an input signal based on internal setting data by a delaying circuit to output as a timing signal;

determining a delay state of each of a plurality of delay signals obtained by sequentially delaying the timing signal based on states of the plurality of delay signals; and changing the internal setting data based on the delay state such that the timing signal approaches an optimum signal.

10. The method according to claim 9, wherein said determining comprises:

generating the plurality of delay signals by sequentially delaying the timing signal; and determining the delay state of each of the plurality of delay signals based on the plurality of delay signals.

11. The method according to claim 10, wherein said generating comprises:

generating a first delay signal by delaying the timing signal by a first one of n delay units (n is a natural number); and generating an $i^{th}$ delay signal (i is an integer satisfying 2 i n) by delaying an $(i-1)^{th}$ delay signal by an $i^{th}$ one of said n delay units.

12. The method according to claim 11, wherein said determining comprises:

determining a state of each of outputs of said n delay units at a predetermined timing as the delay state.

13. The method according to claim 11, wherein each of said n delay units generates a delay for a same time period.

14. The method according to claim 9, further comprising:

changing the internal setting data based on the delay state accomplished after said changing the internal setting data, such that the timing signal approaches an optimum signal.

15. A semiconductor device comprising:

a first circuit configured to generate a plurality of output signals from an input signal; and a determining circuit configured to adjust the input signal based on states of the plurality of output signals during a predetermined period.

* * * * *